(12) United States Patent
Afghahi et al.

(10) Patent No.: US 6,362,666 B1
(45) Date of Patent: Mar. 26, 2002

(54) PRECISION AND FAST RECOVERY BUFFER

(75) Inventors: Morteza Afghahi, Mission Viejo, CA (US); Yueming He, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,102

(22) Filed: Dec. 30, 1999

(51) Int. Cl.$^7$ .................................................. H03B 1/00
(52) U.S. Cl. ......................... 327/108; 327/306; 327/316
(58) Field of Search ............................... 326/82, 83, 85, 326/87, 91; 327/108, 109, 110, 111, 112, 306, 315, 316, 317

(56) References Cited

U.S. PATENT DOCUMENTS

| | | | | |
|---|---|---|---|---|
| 3,822,399 A | * | 7/1974 | Grund et al. ............. 324/103 P |
| 4,570,130 A | * | 2/1986 | Grindel et al. .................. 331/8 |
| 4,581,719 A | * | 4/1986 | Penchuck .................... 365/203 |
| 4,584,559 A | * | 4/1986 | Penney ......................... 327/91 |
| 4,701,715 A | * | 10/1987 | Amazawa et al. ........... 327/384 |
| 5,512,850 A | * | 4/1996 | Mo ............................. 327/108 |
| 5,686,821 A | * | 11/1997 | Brokaw ....................... 323/273 |
| 5,724,008 A | * | 3/1998 | Ferraiolo et al. ............ 327/157 |
| 5,754,072 A | | 5/1998 | Mazzetti ...................... 327/291 |
| 5,929,654 A | * | 7/1999 | Park et al. ..................... 326/58 |
| 6,072,360 A | * | 6/2000 | McCullough ................ 327/558 |

* cited by examiner

Primary Examiner—Kenneth B. Wells
Assistant Examiner—Paul Dinh
(74) Attorney, Agent, or Firm—Blakely, Sokoloff, Taylor & Zafman LLP

(57) ABSTRACT

An embodiment of the invention is directed to a buffer circuit having a closed loop negative feedback amplifier that is coupled to continuously drive a node to a predetermined set voltage. A precharge circuit is coupled to selectively drive the node at a higher rate than the amplifier. The buffer circuit is particularly useful for reducing the recovery and settling time of the node voltage when the node is suddenly subjected to a large, capacitive load.

18 Claims, 6 Drawing Sheets

PRECISION AND FAST RECOVERY BUFFER

FIELD OF THE INVENTION

This invention is generally related to electronic buffer circuits and more particularly to precision buffers which are sometimes called upon to drive a large, capacitive load.

BACKGROUND INFORMATION

Pecision buffers that feature a closed loop negative feedback amplifier (e.g. a unity gain operational amplifier) are used in a wide range of electronic systems to provide increased drive capability for a precise, predetermined voltage. For instance, in image sensor integrated circuits (ICs), a precise analog signal may need to be distributed to each photocell of the sensor array. Although the capacitance presented by each photocell is relatively small, the tens of thousands of such photocells, as they appear in modern high resolution image sensor ICs, present a significant capacitance to the output of a precision buffer. This causes an output node voltage of the buffer to temporarily sag until the capacitive load has been charged up to the set value by the precision buffer. In some applications, the time required for the precision buffer to return its output node voltage to its set value may be tolerated. However, in certain time critical applications such as resetting the photocells of the sensor array in preparation for capturing a sequence of images, it is desirable that the output node voltage be returned to its set value, following the initial drop, in a relatively short period of time. Although the conventional precision buffer is able to accurately return its output to its predetermined set value, its ability to do so in a very short period of time is limited. A limited solution to this problem may be to use a class AB buffer which allows a relatively fast and accurate recovery of the set value in the presence of a large load. However, class AB buffers present the circuit designer with a complex and time consuming design and manufacturing task due to their complex structure. Moreover, in ICs whose performance may be affected by increased heating in the IC, the use of class AB buffers becomes less desirable due to their continuous power consumption characteristics.

SUMMARY

According to an embodiment of the invention, an apparatus is disclosed having a closed loop negative feedback amplifier and a precharge circuit. The amplifier is coupled to continuously drive a node to a predetermined voltage. The precharge circuit is coupled to selectively drive the node at a higher rate than the amplifier.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION

An embodiment of the invention is directed to a precision and fast recovery buffer that is capable of driving a relatively large capacitive load. The precision is obtained using a close loop negative feedback amplifier that is coupled to continuously, i.e. without interruption, drive a node to a predetermined voltage. When the node voltage substantially deviates (e.g. dips) from its predetermined value, due to the presence of the large load, a precharge circuit automatically drives the node back towards its predetermined value, but at a much higher rate than can be obtained from the amplifier. When the node voltage approaches the predetermined value, the precharge circuit is instructed to stop driving the node, thereby allowing the amplifier to accurately bring the node voltage to its predetermined level. In this way, since the output of the amplifier now needs to settle to only a small fraction of its total swing, the settling time of the output is relatively short. This lower settling time is combined with the additional desirable result of faster recovery from the initial dip, due to the relatively high current drive capability of the precharge circuit.

In a particular embodiment of the invention, current surges in the power supply to the amplifier is avoided by running the precharge circuit from a separate supply. This allows the amplifier, as well as other precision analog circuits that are powered by the same supply, to operate in a more stable fashion due to smaller current surges in their supply. In another embodiment of the invention in which the precharge circuit includes a transistor switch that selectively sources or sinks a substantial current into and out of the node, the precision and fast recovery buffer as a whole presents itself as a compact design that also proves to be relatively simple to optimize for the circuit engineer, yet provides an effective solution to the problem of a precision buffer driving a large capacitive load. Additionally, the use of the precharge circuit to selectively drive the node helps limit on-chip power consumption by running a higher current only when needed to recover from the initial transient effect of driving a large load. This makes the invention particularly useful in IC systems that are sensitive to continuously high power consumption levels in the IC.

Figure 1:
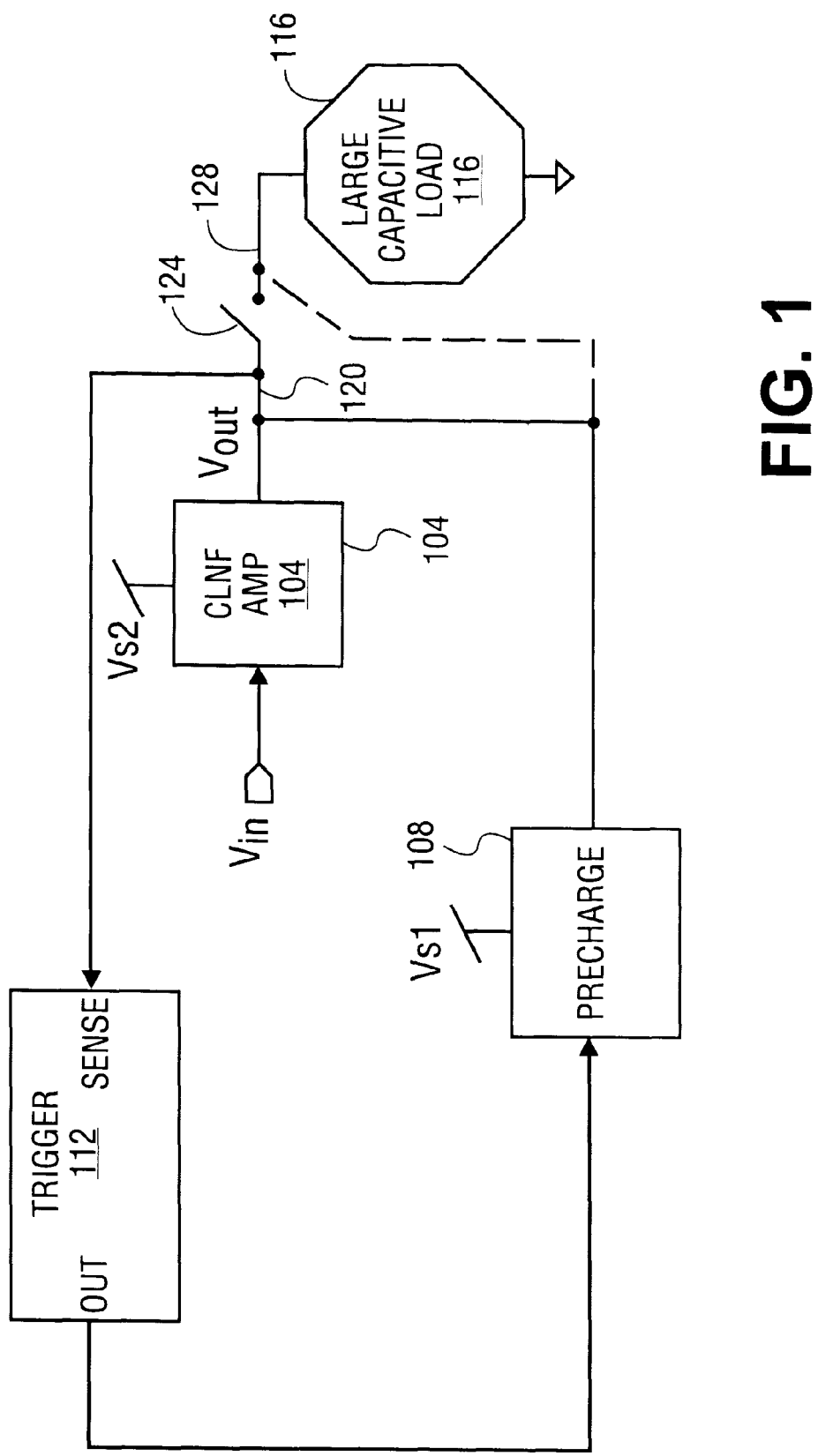
FIG. 1 shows a block diagram of a precision and fast recovery buffer in accordance with an embodiment of the invention.

FIG. 1 shows a block diagram of a precision and fast recovery buffer in accordance with an embodiment of the invention. A closed loop negative feedback (CLNF) amplifier 104 has an input node that receives a predetermined voltage Vin and provides at its output node 120 a voltage Vout. The CLNF amplifier is coupled to continuously drive its output node to a predetermined voltage. This predetermined voltage may be a DC voltage, or it may be part of a voltage range. The amplifier 104 may be based upon an operational amplifier having very high open loop gain but much lower albeit precise closed loop gain. The CLNF amplifier 104 may be configured as a unity gain buffer, or an inverting or non-inverting signal conditioning amplifier with a predetermined voltage gain. One of ordinary skill in the art will recognize that a wide range of amplifier designs are encompassed in the CLNF amplifier 104 of FIG. 1. The CLNF amplifier may also feature a bandgap reference circuit to provide an even more precise, temperature compensated Vout. In general, any amplifier whose output voltage substantially deviates, and takes a relatively long time to recover, in the sudden presence of relatively large capacitive loads may benefit from being incorporated into a circuit as shown in FIG. 1. Examples of such amplifiers include precision operational amplifiers built, for instance, using a complimentary metal oxide semiconductor (CMOS) fabrication process suitable for implementing complex logic functionality.

Figure 2:
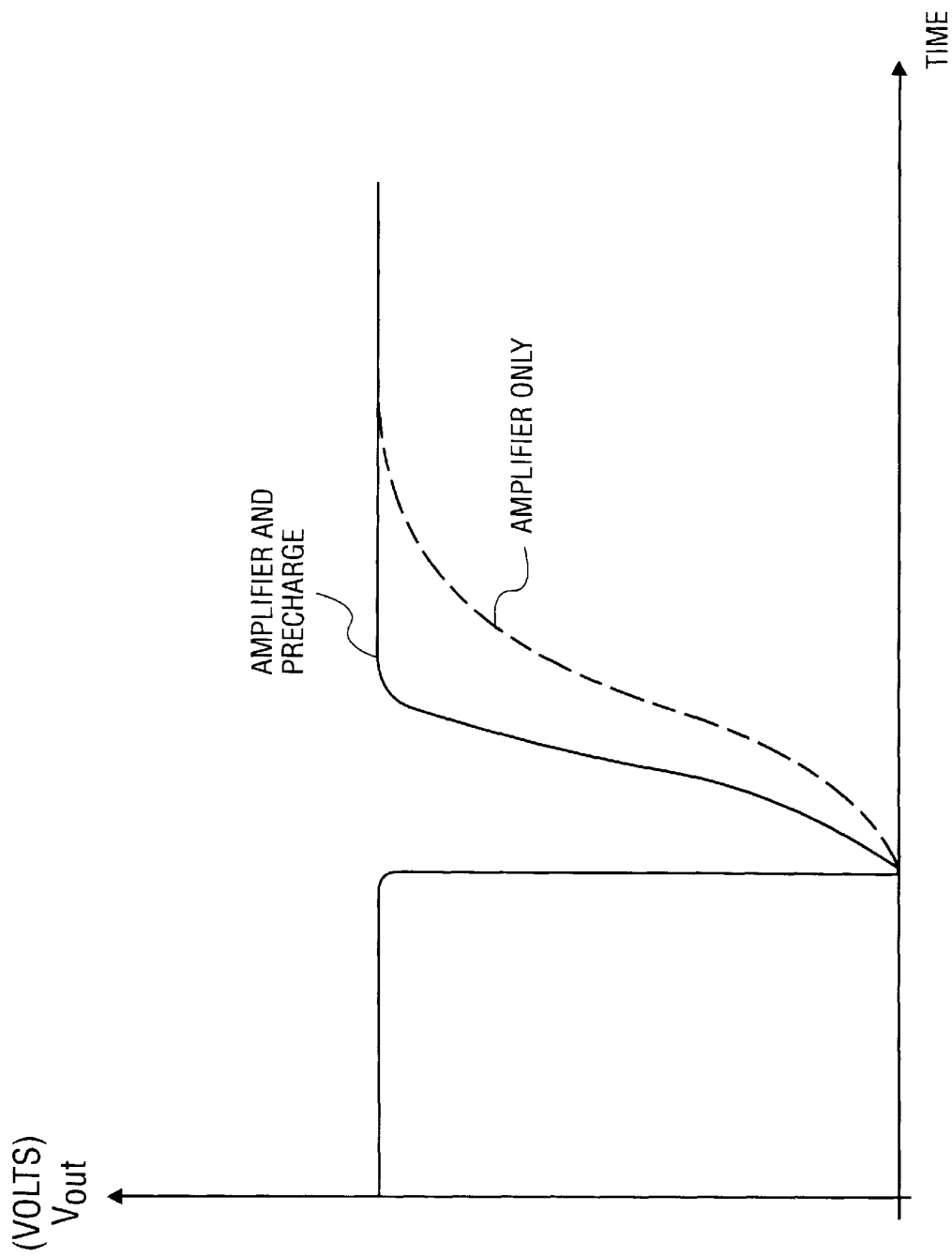
FIG. 2 illustrates plots of the output voltage waveforms of the buffer with and without precharge, while the buffer is driving a large load.

A precharge circuit 108 is coupled to selectively drive the node 120 at a higher rate than the amplifier 104. Thus, the precharge circuit 108 sources or sinks a substantial amount of current through the node 120, or contributes only an insubstantial current such as the leakage current typically obtained from a transistor which has been placed in cutoff mode. The precharge circuit is selectively operable in this way while the amplifier 104 continuously, i.e. without interruption, attempts to source or sink a current to maintain the predetermined voltage, at a current that is significantly less than that available from the precharge circuit. FIG. 2 illustrates the effect of the precharge circuit 108 on the node voltage Vout.

Returning to FIG. 1, the precharge circuit 108 may be controlled by a trigger circuit 112 that is coupled to sense Vout. The trigger circuit 112 is further coupled to signal the precharge circuit 108 to drive the node 120 when Vout deviates substantially from its predetermined value. The substantial deviation may be one which is caused by the sudden onset of a relatively large, capacitive load 116 on the node 120 while the amplifier 104 is driving by itself.

The trigger circuit 112 is further adapted to signal the precharge circuit to stop driving the node once Vout has returned to substantially its predetermined value. This may be done by, for instance, cutting off a transistor in the precharge circuit 108 that is either sourcing or sinking a high current into or out of the node 120. The value of Vout at which the precharge circuit is to stop driving may be one which does not saturate the output of the CLNF amplifier 104, thus allowing the amplifier 104 to quickly return Vout to its predetermined value. This point at which the precharge circuit 108 is disabled depends on at least three factors: the impedance of the large capacitive load 116 to which the output of the CLNF amplifier 104 is subjected, the drive capability of the precharge circuit 108, and the drive capability of the CLNF amplifier 104.

In the embodiment of the invention shown in FIG. 1, the output of the precharge circuit 108 is shown as being shorted to the node 120 which is also shorted to the output of the CLNF amplifier 104. An alternative here would be to short the output of the precharge circuit 108 to a node 128 which in turn is shorted to the large capacitive load 116, as shown by the dotted line. In this alternative, a switch 124 (either mechanical or solid state) is coupled between the node 120 (also called the amplifier output node), and the node 128 to which the large capacitive load 116 is shorted. Thus, although the trigger circuit 112 still senses the voltage at the output node of the CLNF amplifier, in this alternative the precharge circuit 108 drives the amplifier output node through the switch 124 while the switch is closed. The effect of the switch 124 being closed, thereby creating a conductive path between the output of the CLNF amplifier 104 and the large capacitive load 116, is shown in FIG. 2 where the plot of Vout plunges from its determined set value and then recovers after a certain period of time.

Returning to FIG. 1, although the large capacitive load 116 is shown as being referenced to a negative power supply node (here, ground), an alternative would be to reference the load 116 to a positive supply node such as Vs2 or Vs1. For capacitive loads that are referenced to a negative supply node such that Vout dips when the load suddenly appears, the precharge circuit 108 may include a transistor switch that is coupled between either (1) the CLNF amplifier's output node 120 or the node 128 to which the capacitive load 116 is shorted, and (2) a positive supply node such as Vs1 as shown. This allows the precharge circuit to selectively source current into the amplifier output node 120 to raise Vout back towards its set value (see FIG. 2). Alternatively, if the capacitive load is referenced to a positive supply node such that Vout jumps when the load 116 suddenly appears, then the precharge circuit 108 would include a transistor switch that selectively sinks current from either the amplifier output node 120 or the node 128 to lower Vout back towards its set value. These two precharge schemes are called precharge-low and precharge-high and may be combined into the same precision buffer, as another embodiment of the ivention described below in connection with FIG. 5.

Figure 3:
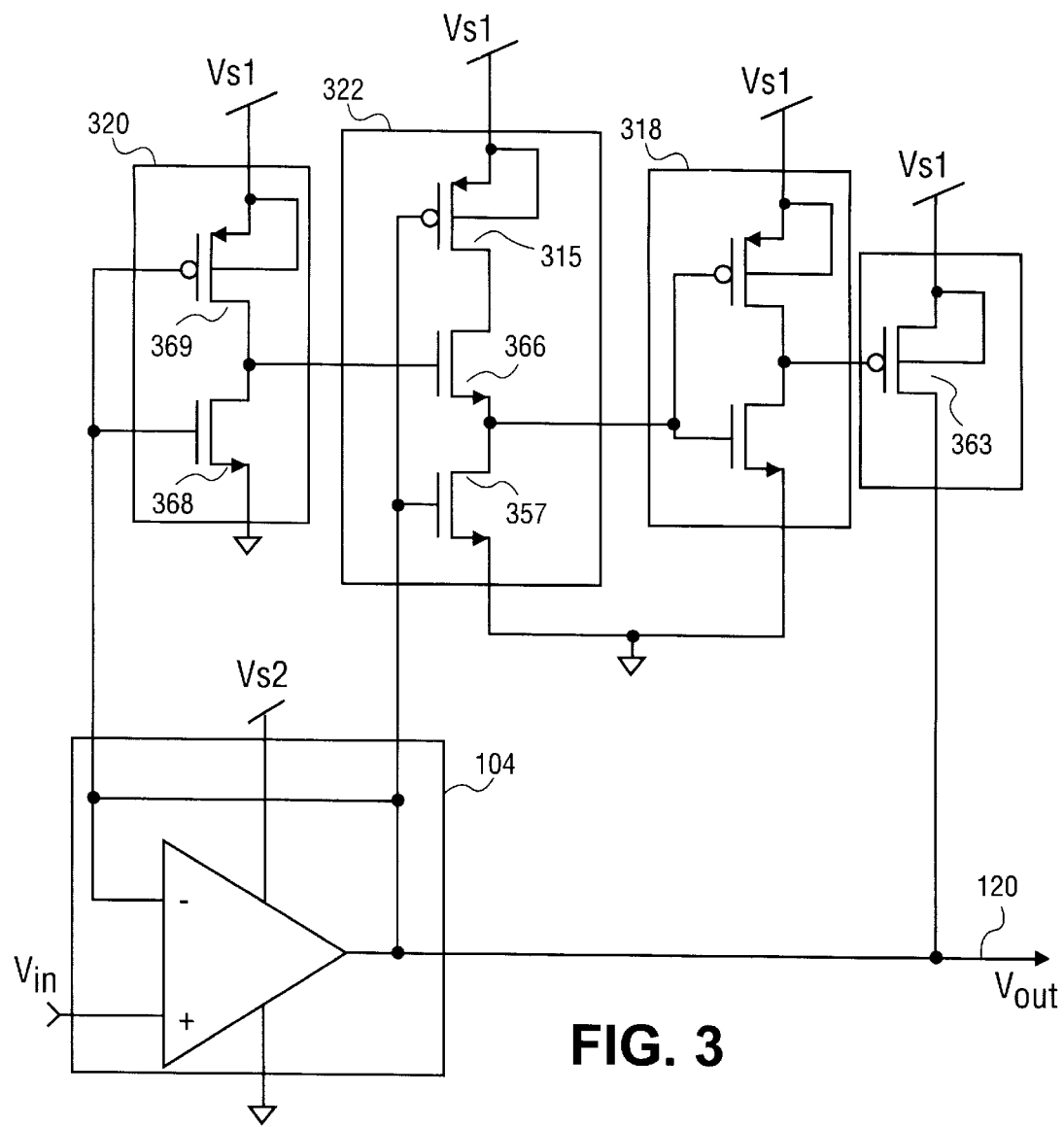
FIG. 3 shows a circuit schematic of a precision buffer according to an embodiment of the invention.

FIG. 3 illustrates a particular implementation of the precision and fast recovery buffer according to an embodiment of the invention. This is a CMOS implementation in which the precharge circuit contains a single p-channel MOS field effect transistor (FET) 363 connected between a positive power supply Vs1 and the output node 120 of the amplifier 104. The amplifier 104 is implemented as an operational amplifier configured with unity gain and powered through a separate positive supply Vs2. The trigger circuit includes a number of CMOS inverters 320, 322, and 318 that are cascaded and the output of which is used to control the p-channel FET 363. The inverters 320 and 322 are coupled to sense Vout. The inverter 320 has a stack of FETs n-channel 368 and p-channel 369 connected between ground and the positive supply Vs1. The inverter 322 has a n-channel 357 and a p-channel 315 between which a n-channel transfer transistor 366 is connected. The inverter 318 essentially acts as a level shifter and edge speed-up circuit to insure that the output of the inverter 322 is properly transferred to control the p-channel FET 363 in the precharge circuit. The transistors in the inverter 320 are sized such that the output of the inverter 320 transitions when Vout is substantially different from its predetermined, set value. On the other hand, the transistors 315 and 357 in the inverter 322 are sized to signal the precharge circuit to stop driving when Vout has returned to a voltage that is near its set value. In a particular embodiment of the invention, the inverter 320 should be sized to be weaker/slower than the inverter 322 which senses Vout as well as controls the precharge transistor 363. In such an embodiment, transistor 366 serves to cut off current in the inverter 322 while Vout is at its set value. The transistor 366 is controlled by the relatively weaker (slower) inverter 320 and reduces power consumption in the relatively stronger (faster) inverter 322 because it cuts off the current in the inverter 322 when Vout is at its set value.

Figure 4:
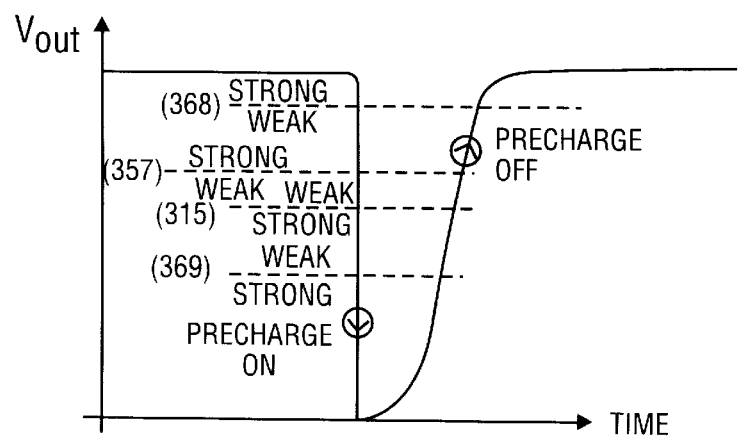
FIG. 4 illustrates a plot of the output voltage of the precision buffer of FIG. 3 and the behavior of certain devices in the CMOS inverters of the buffer.

To help size the constituent transistors of the inverters 320 and 322, FIG. 4 illustrates a proposed explanation of the behavior of these transistors as a function of Vout. Beginning with Vout at its set value, n-channel transistor 368 is sized such that its channel exhibits strong inversion whereas its corresponding p-channel transistor 369 exhibits weak inversion. The transistors 357 and 315 in the second inverter 322 are sized such that when Vout is at its set value, their transitions between strong and weak channel inversion occur as shown in the diagram, between inversion of transistor 368 and that of 369, as Vout drops towards zero volts. The p-channel transistor in inverter 318 should be designed such that its channel is not inverted when the output of inverter 322 reaches its maximum level. This, in turn, will insure that the output of inverter 318 is at a sufficiently low voltage such that the p-channel transistor 363 in the precharge circuit is strongly inverted, thus driving the output node. Thus, it can be seen that the precharge circuit does not start driving until transistor 369 in the first inverter 320 has its channel strongly inverted.

As the output node 120 is driven by the transistor 363, Vout rises as shown in FIG. 4 until the channel of transistor 357 (inverter 322) has strongly inverted. This will cause the output of the inverter 322 to drop to a sufficiently low voltage such that the p-channel transistor in inverter 328 becomes strongly inverted and thereby causes the gate voltage of the transistor 363 to rise to a level that insures weak or very little inversion of the channel in the same device. More particularly, transistor 363 may be placed into cutoff mode so that only a leakage current is sourced into the amplifier's output node 120.

The three-inverter configuration of FIG. 3 has the particular advantage that it can tolerate a relatively large downward swing in Vout before it signals the precharge circuit to start driving. This may be particularly desirable for the situation in which Vout may exhibit noise spikes or other significant deviations from its set value, which are not due to the presence of the large capacitive load 116 (see FIG. 1 momentarily). As an alternative to the configuration of FIG. 3, the slower inverter 320 and the transistor 366 may be eliminated such that the inverter 322 is responsible for both turning on and turning off the precharge using only the pair of transistors 357 and 315. Doing so however may reduce the noise immunity of the trigger circuit since the precharge will be controlled across a much smaller range of voltages than that shown in FIG. 4. In addition, power consumption in the inverter 322 may increase because the transistor 315 is not completely cut off when Vout is at its set value.

Figure 5:
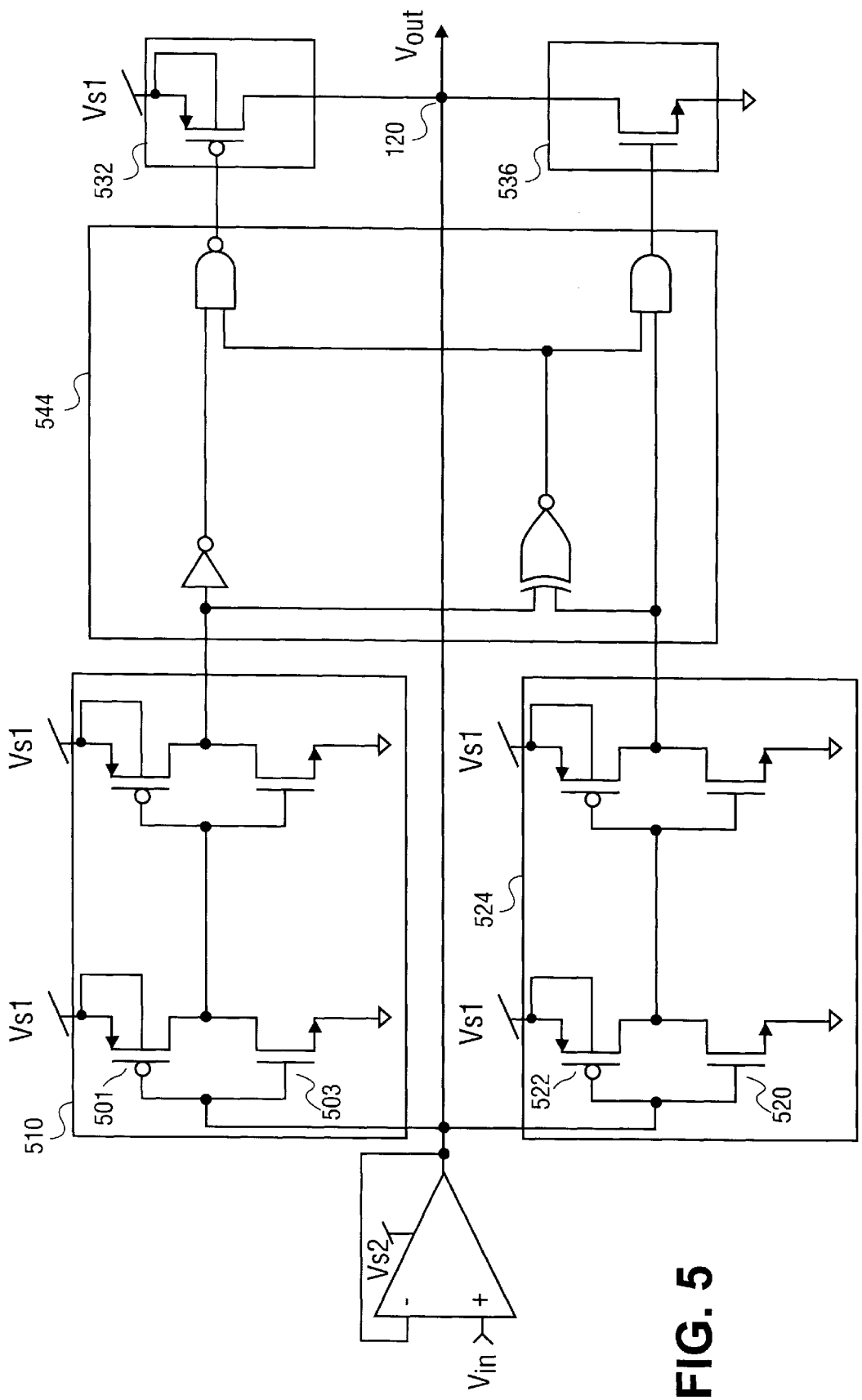
FIG. 5 depicts a circuit schematic of a precision buffer according to another embodiment of the invention.

FIG. 5 illustrates the circuit schematic of a precision and fast recovery buffer according another embodiment of the invention. In this embodiment, the precharge circuit has two components 532 and 536 which allow it to both source and sink current into and out of the amplifier output node 120. The trigger circuit also has two components. Each of the two trigger components 510 and 524 senses the amplifier output node voltage Vout and provides an output signal which transitions when Vout deviates high or low from its set value. The component 510 has a CMOS inverter whose constituent devices, p-channel 501 and n-channel 503, are sized to transition when Vout drops to substantially below its set value. Similarly, in component 524, the CMOS inverter composed of p-channel 522 and n-channel 520 is sized to transition when Vout rises substantially higher than its set value. The outputs from these CMOS inverters are fed to a second stage of level shifting/edge speed up CMOS inverters before being fed to combinational logic 544.

The logic 544 translates the two logic values received from the two trigger components 510 and 524 into the appropriate logic signal levels needed to control the precharge components 532 and 536. The table below illustrates the logic states of trigger components 510 and 524, and the resulting transistor conditions (on=strongly inverted, off= cutoff) in the precharge components 532 and 536, obtained using the combinational logic 544 and the components 510 and 524 of the trigger circuit shown in FIG. 5. These are shown as a function of Vout being its set value, a high value, and a low value.

| COMPONENT IDENTIFIER | Vout | | |
| --- | --- | --- | --- |
| | SET VALUE | LOW | HIGH |
| 510 | 1 | 0 | 1 |
| 524 | 0 | 0 | 1 |
| 532 | OFF | ON | OFF |
| 536 | OFF | OFF | ON |

Figure 6:
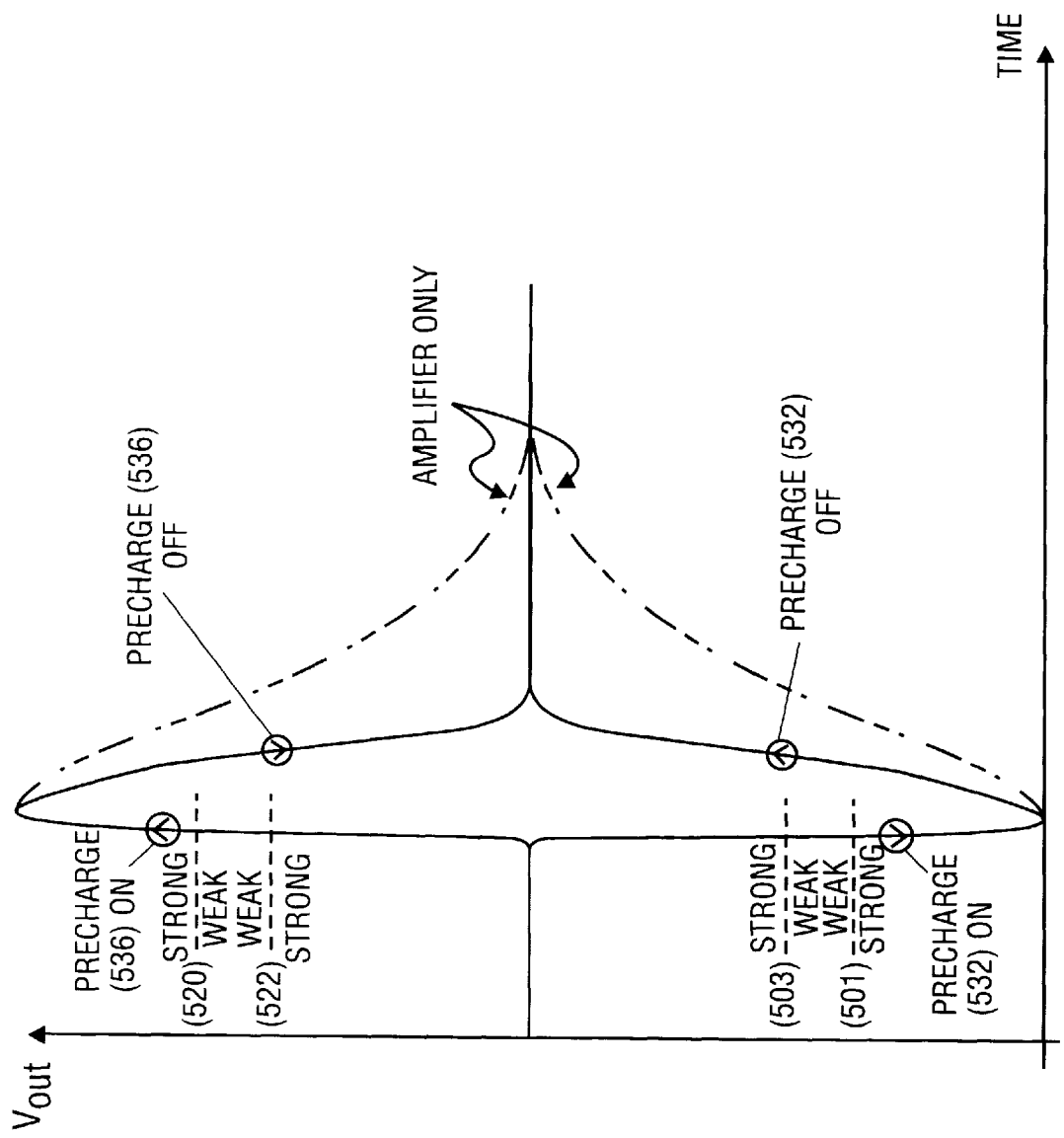
FIG. 6 shows plots of the output voltage waveforms with and without precharge while the circuit of FIG. 5 is driving a large capacitive load.

It can be seen that when Vout is at its set value, the precharge components 532 and 536 are both in cutoff mode, thus not driving Vout. However, when Vout drops to a substantially low value, the transistor in precharge component 532 is strongly inverted and will therefore conduct since Vout is significantly lower than the supply voltage Vs1. This will in turn drive Vout upwards at a relatively high rate. Similarly, if Vout should rise to a level that's substantially above its set value, the reverse operation would occur: the transistor in the precharge component 536 would be strongly inverted and would sink current from the output node, thus driving Vout lower at a relatively high rate. This dual effect is illustrated in FIG. 6 which shows a plot of Vout as a function of time for two scenarios, which, although shown along the same timeline, do not occur simultaneously. Note that precharge component 536 is turned on following the strong inversion of transistor 520 in the trigger component 524. Similarly, precharge component 532 is turned on when the transistor 501 is strongly inverted.

Although some of the embodiments of the invention shown above contemplate the use of separate power supplies Vs1 and Vs2 for the precharge circuit and the CLNF amplifier, this is not a requirement as the invention is also applicable to a system in which the power supplies are the same throughout. In such a system, certain embodiments of the invention nevertheless provide the advantage of a precision Vout, together with fast recovery in Vout should the output node be suddenly subjected to a large capacitive load.

Figure 7:
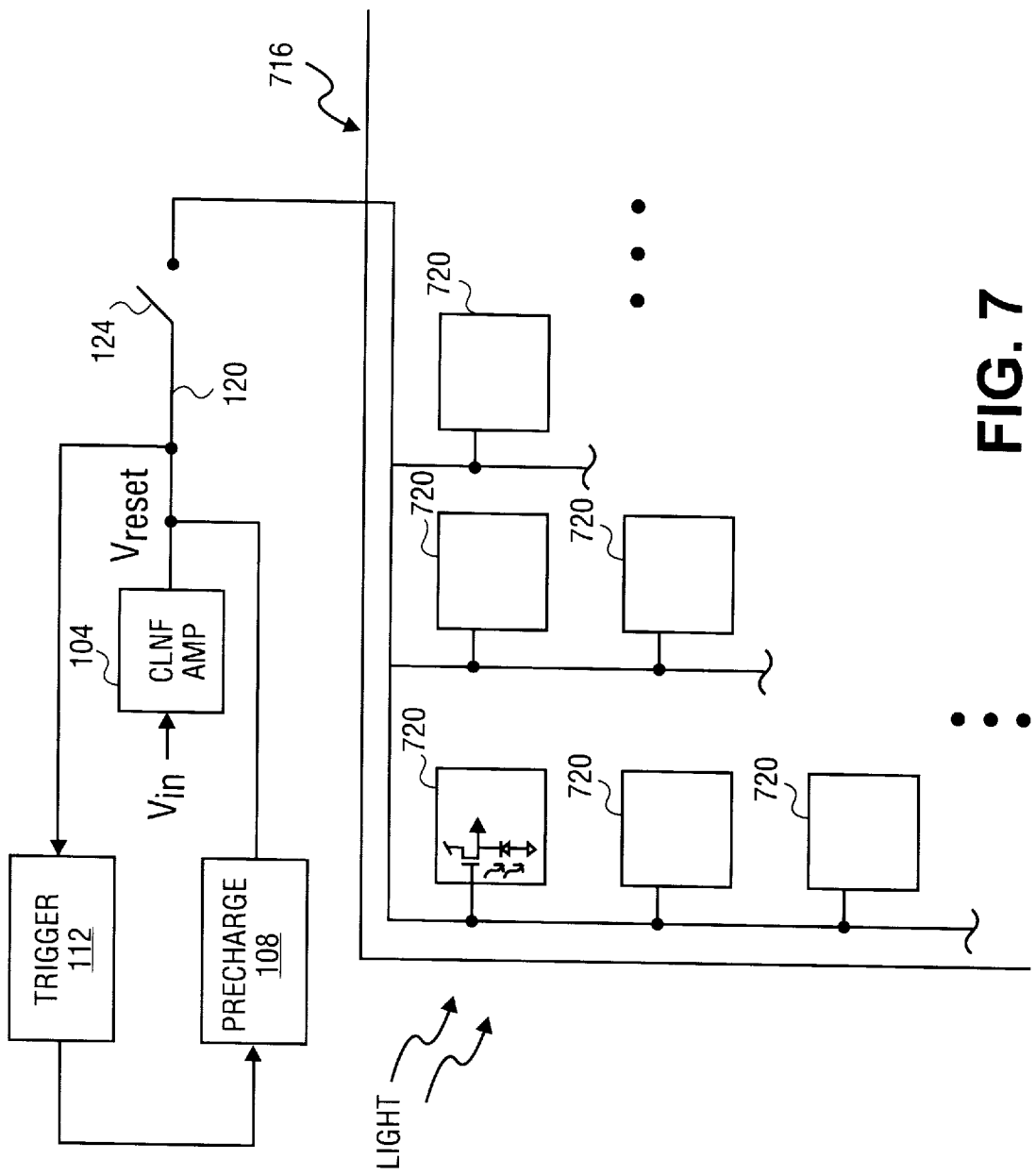
FIG. 7 illustrates a block diagram of an embodiment of the invention in an imaging application.

Examples of systems in which the precision and fast recovery buffer of the invention may be used include an image sensor depicted in FIG. 7 in which the output node 120 of the CLNF amplifier 104 provides a reset voltage Vreset coupled through the switch 124 to a large number of photocells which 720 in a sensor array 716. Each photocell 720 has a reset transistor whose gate receives Vreset when the switch 124 is closed. Although the individual gate capacitance of the reset transistor is relatively small, tens of thousands of such reset transistors together present a relatively large capacitive load. More generally, the invention may be used in a wide range of applications including for instance chip to chip interfaces where a precision buffer in one chip drives a voltage that is to be transferred to several chips, where the link between chips presents a large capacitive load.

To summarize, various embodiments of the invention directed to a precision and fast recovery buffer have been described. In the foregoing specification, the invention has been described with reference to specific exemplary embodiments thereof. It will, however, be evident that various modifications and changes may be made thereto without departing from the broader spirit and scope of the invention as set forth in the appended claims. For instance, a priori knowledge of the impedance that will be actually presented by the load in the manufactured system will allow the precision buffer to be designed so that the trigger circuit responds to fixed, predetermined values of Vout. However, an alternative is to use a programmable trigger circuit if the load impedance cannot be reliably predicted at the design stage. The specification and drawings are, accordingly, to be regarded in an illustrative rather than a restrictive sense.

What is claimed is:

1. An apparatus comprising:
   a closed loop negative feedback amplifier coupled to continuously drive a first node to a first predetermined voltage, a transistor switch coupled between the first node and a second node, a load being coupled to the second node;
   a precharge circuit coupled to selectively drive the first node back towards the first predetermined voltage at a higher rate than can the amplifier by itself; and
   a trigger circuit coupled to sense the first node voltage, and coupled to signal the precharge circuit to drive the first node when the first node voltage is substantially different than the first predetermined voltage due to the transistor switch being closed.

2. The apparatus of claim 1 wherein the trigger circuit is further adapted to signal the precharge circuit to not drive the first node when the first node has returned to substantially the first predetermined voltage.

3. The apparatus of claim 2 wherein the trigger circuit includes first and second CMOS inverters each coupled to sense the first node voltage, the first CMOS inverter being adapted to signal the precharge circuit to start driving and the second CMOS inverter being adapted to signal the precharge circuit to stop driving.

4. The apparatus of cliam 3 wherein the trigger circuit includes first and second CMOS inverters each coupled to sense the first node voltage, the first CMOS inverter being adapted to signal the high transitor to source current, and the second CMOS inverter being adapted to signal the low transistor to sink current.

5. The apparatus of claim 4 wherein the trigger circuit is further adapted to signal the high and low transitors to stop sourcing and sinking current, respectively, when the first node voltage has returned to substantially the first predetermined voltage.

6. The apparatus of claim 2 wherein the precharge circuit includes a high transitor coupled between the first node and positive supply node to source current into the first node responsive to the trigger circuit, and a low transistor coupled between the first node and a negative supply node to sink current from the first node responsive to the trigger circuit.

7. The apparatus of claim 1 wherein the precharge circuit has an output that is shorted to the second node.

8. The apparatus of claim 1 wherein the load includes a plurality of photocells in an image sensor array, each photocell having a reset transistor coupled to the second node to be driven by the amplifier and the precharge circuit through the switch.

9. The apparatus of claim 1 wherein the precharge circuit includes a transistor switch coupled between the first node and a positive supply node to source current into the first node responsive to the trigger circuit.

10. An apparatus comprising:
    first means for driving a first node to a first predetermined voltage;
    means for blocking current between the first node and a second node;
    second means for driving the first node back towards the first predetermined voltage at a higher rate than can the first driving means by itself; and
    means for loading the second node to substantially change the first node voltage while the first driving means is driving and while the blocking means is not blocking; and
    means for signaling the second driving means to drive the first node towards the first predetermined voltage when the first node has changed to a second predetermined voltage due to said blocking means not blocking current between the first node and the second node.

11. The apparatus of claim 10 further comprising:
    means for signaling the second driving means to stop driving the first node voltage when the first node voltage has changed to a third predetermined value, wherein the first driving means is capable of returning the first node voltage from its third predetermined value to its first predetermined value.

12. The apparatus of claim 10 wherein:
    the second driving means is shorted to the second node to drive the first node through the second node.

13. A method comprising:
    enabling a closed loop negative feedback amplifier to drive a first node to a first predetermined voltage; and
    enabling a precharge circuit to drive the first node back towards the firstpredetermined voltage at a higher rate than can the amplifier by itself;
    capacitively loading the first node causing the first node to change substantially from the first predetermined voltage by closing a transistor switch coupled between the first node and a second node, a load being coupled to the second node; and
    automatically signaling the precharge circuit to drive the first node responsive to the first node reaching a second predetermined voltage.

14. The method of claim 13 further comprising:
    automatically signaling the precharge circuit to stop driving the first node responsive to the first node voltage reaching a third predetermined value, allowing the closed loop negative feedback amplifier to return the first node voltage from its third predetermined value to its first predetermined value.

15. The method of claim 13 wherein the second predetermined value is smaller than the first predetermined value.

16. An apparatus comprising:
    a closed loop negative feedback amplifier coupled to drive a first node to a first predetermined voltage;
    a precharge circuit;
    a switch coupled between the first node and a second node, wherein the precharge circuit has an output that is shorted to the second node; and
    a trigger circuit coupled to sense the first node voltage, and coupled to signal the precharge circuit to drive the first node when the first node voltage is substantially different than the first predetermined voltage, wherein the precharge circuit includes a transistor switch coupled between the first node and a positive supply node to source current into the first node responsive to the trigger circuit.

17. The apparatus of claim 16 wherein the trigger circuit is further adapted to signal the precharge circuit to not drive the first node when the first node has returned to substantially the first predetermined voltage.

18. The apparatus of clam 16 further comprising:
    a load coupled between the second node and a power supply node wherein the load includes a plurality of photocells in an image sensor array, each photocell having a reset transistor coupled to the second node to be driven by the amplifier and the precharge circuit.

* * * * *

UNITED STATES PATENT AND TRADEMARK OFFICE
CERTIFICATE OF CORRECTION

PATENT NO.   : 6,362,666 B1
DATED        : March 26, 2002
INVENTOR(S)  : Afghahi et al.

It is certified that error appears in the above-identified patent and that said Letters Patent is hereby corrected as shown below:

<u>Column 1,</u>
Line 10, delete "Pecision", insert -- Precision --.

<u>Column 2,</u>
Line 56, after "amplifier", insert -- 104 --.

<u>Column 4,</u>
Line 20, delete "ivention", insert -- invention --.

Signed and Sealed this

Seventh Day of January, 2003

JAMES E. ROGAN
*Director of the United States Patent and Trademark Office*